United States Patent
Zhang et al.

(10) Patent No.: US 7,851,273 B2
(45) Date of Patent: Dec. 14, 2010

(54) METHOD OF TESTING AN INTEGRATED CIRCUIT DIE, AND AN INTEGRATED CIRCUIT DIE

(75) Inventors: Kangping Zhang, Fremont, CA (US); Fong Long Lin, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/762,825

(22) Filed: Apr. 19, 2010

(65) Prior Publication Data

US 2010/0203654 A1      Aug. 12, 2010

Related U.S. Application Data

(62) Division of application No. 12/113,881, filed on May 1, 2008, now Pat. No. 7,728,361.

(51) Int. Cl.
*H01L 21/82* (2006.01)
*H01L 27/10* (2006.01)

(52) U.S. Cl. ........................... 438/129; 257/203

(58) Field of Classification Search ......... 438/128–129, 438/461, 611; 257/203, 735
See application file for complete search history.

(56) References Cited

U.S. PATENT DOCUMENTS 5,641,978 A * 6/1997 Jassowski .................... 257/203
7,728,361 B2 * 6/2010 Zhang et al. ................. 257/203

* cited by examiner

*Primary Examiner*—Calvin Lee
(74) *Attorney, Agent, or Firm*—DLA Piper LLP (US)

(57) ABSTRACT

In the present invention, a method of testing an unpackaged integrated circuit die is disclosed. The die has a plurality of first input/output pads. A serial electrical connection is fabricated in the die between all of the input/output pads of the die which are not of the first plurality (hereinafter: "second plurality"). The second plurality has a start input and an end output. The start input of the second plurality is connected to the output of one selected input buffer of the input pad of the first plurality and the end output of the second plurality is also connected to the input of one selected output pad of the first plurality. The second plurality of input/output pads are tested through selected input pad and selected output pad of the first plurality without electrical probes making contact during the wafer sort. The present invention also relates to an integrated circuit die so fabricated as to facilitate testing.

5 Claims, 1 Drawing Sheet

METHOD OF TESTING AN INTEGRATED CIRCUIT DIE, AND AN INTEGRATED CIRCUIT DIE

CROSS REFERENCE TO RELATED APPLICATIONS

This application is a divisional of U.S. application Ser. No. 12/113,881, filed May 1, 2008, the entire contents of both are incorporated herein by reference.

TECHNICAL FIELD

The present invention relates to a method of testing an unpackaged integrated circuit die, as well as an integrated circuit die so fabricated as to facilitate testing.

BACKGROUND OF THE INVENTION

A packaged integrated circuit device typically has one or more integrated circuit dies contained therein. Each integrated circuit die must be tested in its die form before packaging (typically called "wafer sort testing"). Wafer sort testing has two competing trade-offs. On one hand, it is desired to test all of the input/output pads. However, on the other hand, it is desirable to keep the test cost down, as well as to test the die rapidly.

One prior art solution is to test the die in wafer sort using only some of the input/output pads. Thereafter, during the final test, i.e. after the die is packaged, the other input/output pads, i.e. input/output pads not tested during wafer sort, are tested. Although, this method is fast and inexpensive, it could result in the case that defective dies are packaged, because those input/output pads that are not wafer sort tested cause a fault during final testing (i.e. after packaging). This results in the scraping of the packaged device. Scraping the packaged device is costly.

Another prior art solution is to test all of the input/output pads during wafer sort. Although, this solution is more expensive and time consuming, it will detect defective dies while still at the wafer sort stage, before the defective die is packaged.

Another complication is that in the packaging of MCP (Multi-chip Packaging), wherein a number of dies are packaged together in a single package, some input/output pads of a die may be used to connect to other dies, internal to the MCP and never be tested (or accessible to testing) after final MCP packaging.

Hence there is a need to solve the problem of wafer sort testing in an inexpensive and rapid manner, as well as the problem of testing input/output pads of a die that are internal to a MCP package.

SUMMARY OF THE INVENTION

In the present invention, a method of testing an unpackaged integrated circuit die is disclosed. The die has a plurality of first input/output pads. A second plurality of input/output pads from the first input/output pads is selected, wherein the second plurality is less than the first plurality. A serial electrical connection is fabricated in the die between all of the input/output pads of the die which are not of the second plurality (hereinafter: "third plurality"). The third plurality has a first end and a second end. The first end of the third plurality is connected to one of the input/output pads of the second plurality and the second end of the third plurality is also connected to another of the input/output pads of the second plurality. The second plurality of input/output pads are tested. The present invention also relates to an integrated circuit die so fabricated as to facilitate testing.

DETAILED DESCRIPTION OF THE INVENTION

Figure 1:
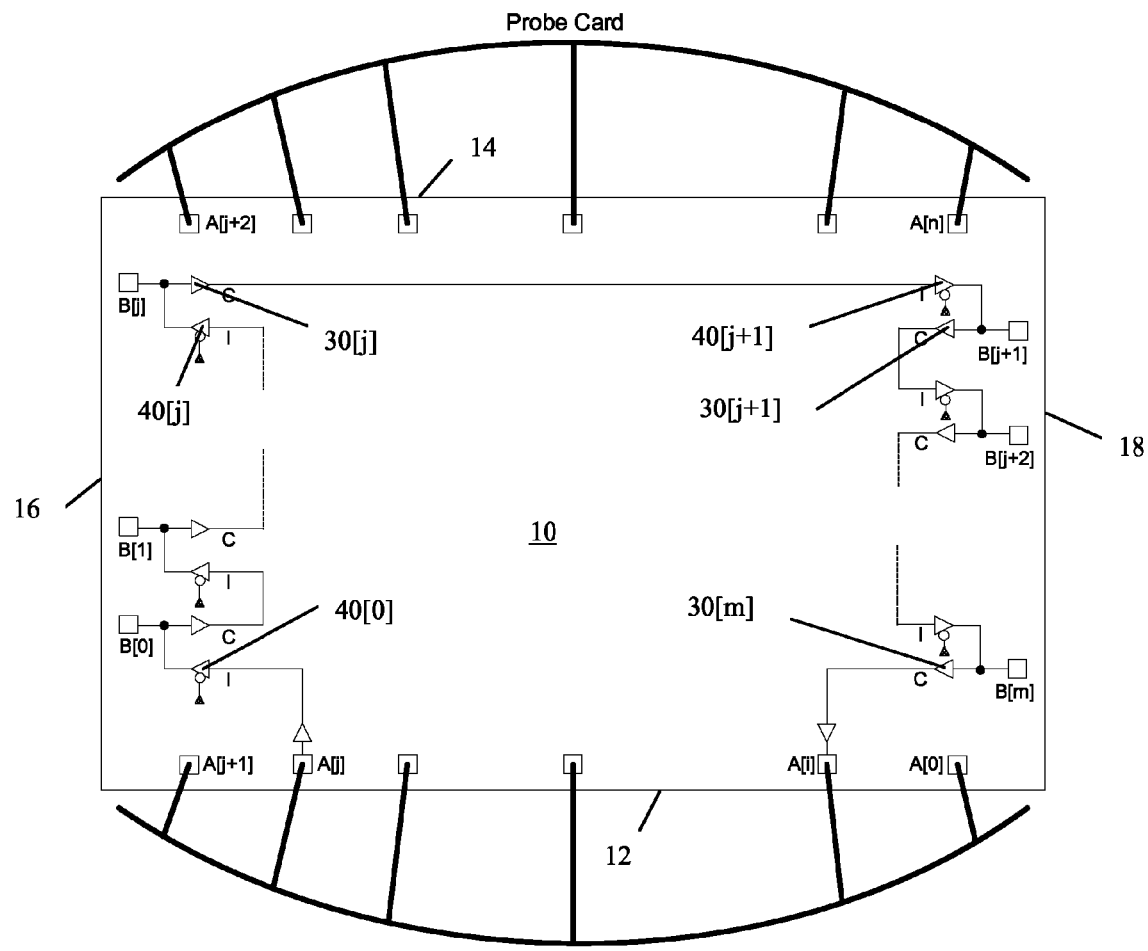
FIG. 1 is a circuit diagram of an integrated circuit die of the present invention, as well as being used in the method of the present invention.

Referring to FIG. 1 there is shown an unpackaged integrated circuit die 10 of the present invention, as well as being used in the method of the present invention. The die 10, in the preferred embodiment, is substantially rectilinearly shaped, having two pairs of opposed sides. A first plurality of input/output pads A[0]-A[n] are positioned or located substantially around the periphery of two sides, 12 and 14 of the die 10. The input/output pads labeled as A[0] through A[j+1] are positioned along the periphery of the first side 12 of the die 10, while the input/output pads A[j+2] through A[n] are positioned along the periphery of the second side 14 of the die 10, which is opposite the first side 12. The die 10 has also a second plurality of input/output pads, B[0] through B[m] which are also located along the periphery of the die 10. The input/output pads labeled as B[0] through B[j] are positioned along the periphery of a third side 16 of the die 10, while the input/output pads B[j+1] through B[m] are positioned along the periphery of the fourth side 18 of the die 10, which is opposite the third side 16. Collectively, the first plurality of input/output pads A[0]-A[n], and the second plurality of input/output pads B[0]-B[m], form all of the input/output pads of the die 10.

The die 10 has a circuit function (not shown), which is typically located near the central region of the die, i.e. away from the periphery of the die 10. The circuit function is connected to the first plurality A[0]-A[n] of input/output pads and the second plurality B[0]-B[m] of input/output pads. Each of the pads has a function, such as input or output in relationship to the circuit function. However, in the die 10 of the present invention, for the purpose of testing, additional circuit elements are fabricated on the die 10 such that each pad of the second plurality of pads, i.e. B[0]-B[m], has an input buffer and an output buffer associated therewith. Thus, for example, the pad B[j] has an input buffer 30[j] and an output buffer 40[j] fabricated in the die 10. Further, all of the pads within the second plurality are connected in series, such that the output of the input buffer is connected to the input of the output buffer associated with an adjacent pad. Thus, for example, the output of the input buffer 30[j] is connected to the input of the output buffer 40[j+1]. The output of the output buffer 40[j+1] is connected to the pad B[j+1] and to the input of the input buffer 30[j+1]. Further, the output of the input buffer 30[j+1] is then connected to the input of the output buffer 40[j+2] etc. Finally, the serially connected second plurality of buffers B[0]-B[m] has two ends: a start input, which is the input to the output buffer 40[0], and an end output, which is the output of the input buffer 30[m]. The start input, which is the input to the output buffer 40[0], is also connected to the output of the input buffer of one of the first plurality A[0]-A[n] of pads. In the example shown in FIG. 1, the start input is connected to the pad A[j]. The end output, which is the output of the input buffer 30[m], is also connected to the input of the output buffer of another selected pad of the first plurality A[0]-A[n] of pads. In the example shown in FIG. 1, the end output is connected to pad A[i].

In the method of the present invention, once the die 10 has been fabricated with the input buffers 30 and the output buffers 40 connected in the manner described heretofore to the second plurality of input/output pads B[0]-B[m], during the wafer sort test stage, probe cards with electrical probes make contact with the first plurality of input/output pads A[0]-A[n]. Because the input/output pads of the second plurality B[0]-B[m] are connected to the first plurality A[0]-A[n], when wafer testing of the first plurality A[0]-A[n] occurs, the second plurality B[0]-B[m] are also tested. All of the pads of the second plurality B[0]-B[m] are forced into the test mode by an output of the input buffer of an input pad (used for testing purpose) or a test mode generator (not shown). During the testing, in the test mode, all pads of the second plurality B[0]-B[m] that are input, output or input/output during "normal" operation are configured to output with the input active. All pads of the second plurality B[0]-B[m] are reverted back to their "normal" operation once the test mode is no longer active. In this manner, the serially connected chain of second plurality of input/output pads are tested.

Once the die 10 is tested, it can be packaged. In particular, if the die 10 is packaged in a MCP package then the first plurality of input/output pads A[0]-A[n] which are tested with electrical probes making contact during the wafer sort test are internally connected within the MCP and not available for external testing or access to testing. With the method of the present invention, the second plurality of pads, B[0]-B[m], which were tested through the selected input pad and the selected output pad of the first plurality A[0]-A[n] of pads but without electrical probes making contact during wafer sort test, are bonded to outside out side of the MCP and available for external testing or access to further testing with electrical contact during the final test of the MCP package. Thus, even for MCP package, all of the pads of the die 10 are tested during wafer sort test, with the pads that would otherwise be hidden within the MCP package subject to probes making electrical contact with those pads. Thereafter, during final test. The pads not subject to the probes making electrical contact during the wafer sort test stage are further tested during final test.

It should be recognized that there are many advantages to the die and method of the present invention. The present invention permits rapid wafer sort testing at a minimal increase in cost.

What is claimed is:

1. A method of testing an unpackaged integrated circuit die, having a plurality of first input/output pads, said method comprising:

selecting a second plurality of input/output pads, wherein said second plurality being less than the first plurality;

fabricating in said die a serial electrical connection between all of the input/output pads of said die which are not of the second plurality (hereinafter: "third plurality"); wherein said third plurality having a first end and a second end;

connecting the first end of the third plurality to one of the input/output pads of said second plurality and the second end of the third plurality to another of the input/output pads of said second plurality; and testing the second plurality of input/output pads.

2. The method of claim 1 wherein the fabricating step comprises:

forming an input buffer, having an input and an output, and an output buffer, having an input and an output, for each of the pads of the third plurality, with each pad connected to the input of the input buffer, and to the output of the output buffer; and electrically connecting the output of an input buffer of one pad of the third plurality to the input of an output buffer of an adjacent pad of the third plurality.

3. The method of claim 2 wherein the second plurality is along the periphery of said integrated circuit die.

4. The method of claim 3 wherein said die is substantially rectilinearly shaped, and wherein said second plurality is along opposite sides of the periphery of said die.

5. A method of testing an integrated circuit device, having an integrated circuit die with a plurality of first input/output pads, said method comprising:

selecting a second plurality of input/output pads, wherein said second plurality being less than the first plurality;

fabricating in said die a serial electrical connection between all of the input/output pads of said die which are not of the second plurality (hereinafter: "third plurality"); wherein said third plurality having a first end and a second end;

connecting the first end of the third plurality to one of the input/output pads of said second plurality and the second end of the third plurality to another of the input/output pads of said second plurality;

testing the second plurality of input/output pads;

packaging said die into the integrated device; and testing the device by testing said third plurality of input/output pads.

* * * * *